US006573772B1

(12) United States Patent
Dai et al.

(10) Patent No.: US 6,573,772 B1

(45) Date of Patent: Jun. 3, 2003

(54) METHOD AND APPARATUS FOR LOCKING SELF-TIMED PULSED CLOCK

(75) Inventors: Xia Dai, Santa Clara, CA (US); Thomas D. Fletcher, Portland, OR (US)

(73) Assignee: Intel Corporation, Santa Clara, CA (US)

(*) Notice: Subject to any disclaimer, the term of this patent is extended or adjusted under 35 U.S.C. 154(b) by 99 days.

(21) Appl. No.: 09/608,485

(22) Filed: Jun. 30, 2000

(51) Int. Cl.[7] .......................... G11C 7/00; H03K 17/28

(52) U.S. Cl. ........................ 327/172; 327/151; 365/207

(58) Field of Search ................................ 327/170, 172, 327/211, 261, 50, 51; 365/207, 205, 201

(56) References Cited

U.S. PATENT DOCUMENTS

| | | | | |
|---|---|---|---|---|
| 4,713,797 A | | 12/1987 | Morton et al. | 365/208 |
| 4,825,110 A | | 4/1989 | Yamaguchi et al. | 365/207 |
| 5,034,636 A | | 7/1991 | Reis et al. | 365/49 |
| 5,055,706 A | * | 10/1991 | Nakai et al. | 327/172 |
| 5,327,379 A | | 7/1994 | Pascucci | 365/190 |
| 5,355,391 A | | 10/1994 | Horowitz | 375/257 |
| 5,396,110 A | * | 3/1995 | Houston | 327/172 |
| 5,594,696 A | | 1/1997 | Komarek et al. | 365/208 |
| 5,949,256 A | | 9/1999 | Zhang et al. | 327/57 |
| 6,181,591 B1 | | 1/2001 | Miyatake et al. | 365/49 |
| 6,314,039 B1 | * | 11/2002 | Hill et al. | 365/207 |

FOREIGN PATENT DOCUMENTS

| | | | | |
|---|---|---|---|---|
| JP | 1202021 | | 8/1989 | H03K/5/13 |
| JP | 401202021 A | * | 8/1989 | |

* cited by examiner

*Primary Examiner*—Dinh T. Le

(74) *Attorney, Agent, or Firm*—Blakely, Sokoloff, Taylor & Zafman LLP

(57) ABSTRACT

A method and apparatus for generating multiple locked self-timed pulsed clock signals is disclosed. Race margins are reduced over separate clock generating circuits by sharing the necessary delay circuit elements between the multiple clock generating circuits. An edge is gated with a delayed edge to form the first clock pulse. A subsequent second clock pulse is generated by gating a partially-delayed edge with the first clock pulse, which minimizes race margins and pulse evaporation.

9 Claims, 11 Drawing Sheets

D 1
D 2
D 3
D 4
PLA 1
710
SA 1
SA 2
SA 3
SA 4
712
714
716
718
CLK 1
720
CLK 2
722
PLA 2
740
SA 5
SA 6
SA 7
SA 8
742
744
746
748
O 1
O 2
O 3
O 4

METHOD AND APPARATUS FOR LOCKING SELF-TIMED PULSED CLOCK

FIELD OF THE INVENTION

The present invention relates to a sense amplifier, and, more specifically, to a single-ended sense amplifier with improved biasing and clocking.

BACKGROUND

Programmable Logic Arrays (PLA) are an efficient manner of implementing random logic functionality in a non-custom integrated circuit. A typical PLA contains gates arrayed in a programmable matrix with many data input terminals and data output terminals presented for use when using the PLA in a system. The output of each logic path within the array is prepared for external use by a sense amplifier. The sense amplifier detects the data output state of each logic path within PLA array and buffers it for use by circuitry external to the PLA proper.

Prior applications of PLAs have traditionally used differential logic paths. Each logic path is physically represented by a data signal, D, and a logical compliment of the data signal, D#. The use of the differential logic paths provided superior common-mode noise rejection. As part of using differential logic paths, differential sense amplifiers were used in these PLAs. These differential sense amplifiers provided a differential input with terminals for D and D# signals, and provided complimentary output terminals for output data signals O and output data compliment signals O#.

Newer requirements for PLA design include much higher speed and the use of low voltage swing (LVS) logic levels. These requirements have made the necessity of providing sufficient circuitry to implement both a D and a D# signal path in each logic path of the PLA burdensome, both in terms of propagation delay tolerances and in terms of area required on the chip. It would be possible to use a single-ended sense amplifier, one with only a D input terminal, to eliminate the necessity of providing both a D and a D# signal path in each logic path. However, shortcomings have been shown in the use of traditional single-ended sense amplifier designs in an LVS design. The difference between the two signaling voltages in an LVS design, $\Delta V$, is not tightly controlled in an LVS design. The $\Delta V$ may vary from one wafer to another with differences in process. Moreover, the value of $\Delta V$ may be only hundreds of millivolts, not the volts of other logic families.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION

A method and apparatus for providing a single-ended sense amplifier is described. A single-ended sense amplifier may include a differential input configuration with a data input transistor and a dummy input transistor. A reset circuit may equalize these transistors when between sensing cycles of a clock signal. A controlled offset in the size of the data input transistor and the dummy input transistor may increase noise immunity and other performance attributes, especially when used in conjunction with a dummy input signal generated in a dummy complimentary path.

Figure 1:
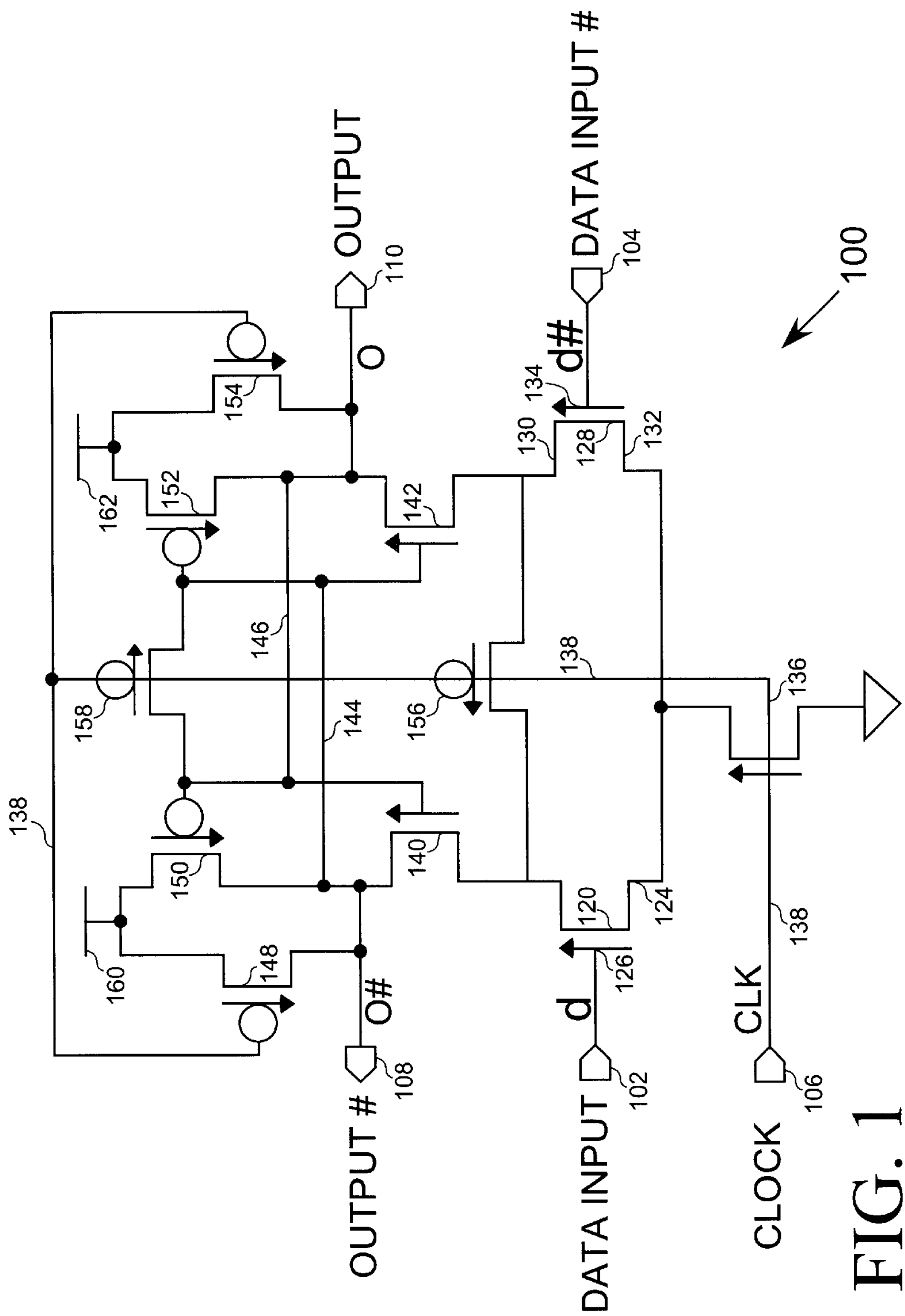
FIG. 1 is a schematic diagram of a differential sense amplifier.

Referring now to FIG. 1, a schematic diagram of a differential sense amplifier 100 is shown. Differential sense amplifier 100 includes a non-inverting data input D terminal 102, an inverting data input D# terminal 104, a clock input CLK terminal 106, a non-inverted data output O terminal 110, and an inverted data output O# terminal 108.

Differential sense amplifier 100 uses a clock signal on CLK terminal 106 to keep the circuits in a reset state when not actively sensing. When the clock signal is at a logic low state (reset state), all P-channel metal-oxide-semiconductor (PMOS) transistors whose gates are tied to common gate connection 138 turn on. PMOS transistor 156 equalizes the drains 122, 130 of N-channel metal-oxide-semiconductor (NMOS) transistors 120, 128, respectively. PMOS transistor 158 equalizes the gates of PMOS transistors 150, 152. PMOS transistors 148, 154 connect O# terminal 108 to Vcc connection 160 and O terminal 110 to Vcc connection 162, respectively, equalizing the output signals. Also, when the clock signal is at a logic low state, NMOS transistor 136 turns off and removes a ground connection from sources 124, 132 of NMOS transistors 120, 128, respectively.

Differential sense amplifier 100 utilizes positive feedback. Feedback path 144 gives positive feedback from the output totem-pole path of PMOS transistor 150 and NMOS transistor 140 to the inputs (gates) of PMOS transistor 152 and NMOS transistor 142. Similarly, feedback path 146 gives positive feedback from the output totem-pole path of PMOS transistor 152 and NMOS transistor 142 to the inputs (gates) of PMOS transistor 150 and NMOS transistor 140. It is noteworthy that feedback paths 144, 146 are connected via PMOS transistor 158 when the clock signal is in the reset state.

Differential sense amplifier 100 may then use the clock signal on CLK terminal 106 to enable the circuits for actively sensing. When the clock signal is at a logic high state (evaluation state), all P-channel metal-oxide-semiconductor (PMOS) transistors whose gates are tied to common gate connection 138 turn off. When turned off, PMOS transistor 158 disconnects the feedback paths 144, 146 and thereby disconnects the O# terminal 108 from the O terminal 110. When turned off, PMOS transistor 156 permits the voltages at drain 122 and drain 130 to vary. Finally, when turned off, PMOS transistors 148, 154 disconnect O# terminal 108 from Vcc connection 160 and O terminal 110 from Vcc connection 162, respectively, allowing the output signals to vary from Vcc. When the clock signal is at a logic high state, NMOS transistor 136 turns on and supplies a ground connection to sources 124, 132 of NMOS transistors 120, 128, respectively, allowing drain to source current to flow in NMOS transistors 120, 128.

It is possible to use differential sense amplifier 100 as a single-ended sense amplifier by connecting a reference threshold voltage to D# terminal 104. One such possible reference threshold voltage is Vcc. Other possible reference voltages could be derived in a manner more responsive to the value of ΔV used in the LVS implementation. However, the value of ΔV may not be well-controlled in a given LVS design, varying greatly from chip to chip with normal process variation.

Figure 2:
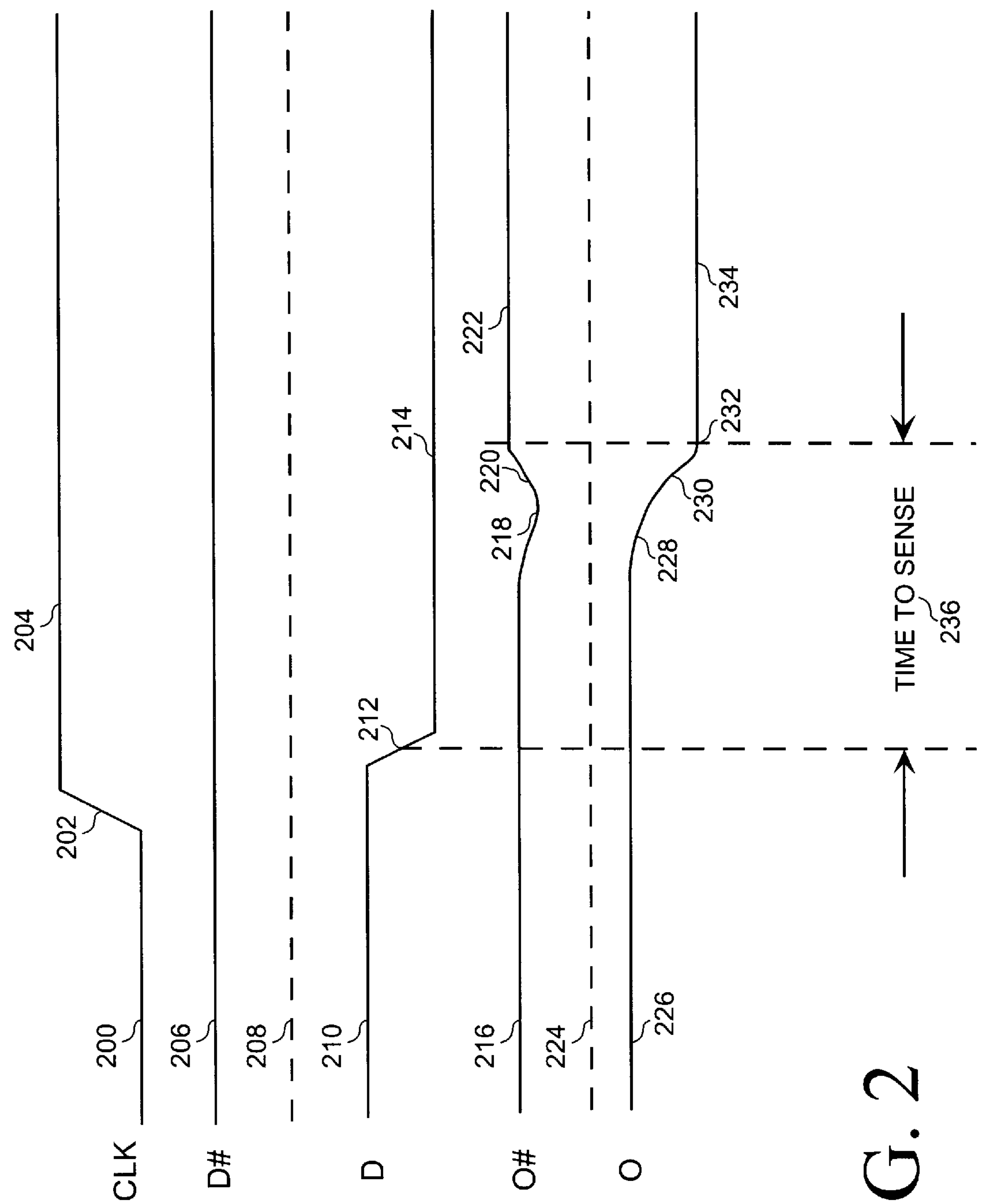
FIG. 2 is a timing diagram for the sense amplifier of FIG. 1.

Referring now to FIG. 2, a timing diagram for the sense amplifier of FIG. 1 is shown. In the timing diagram of FIG. 2, the D# terminal 104 is connected to Vcc. Hence the signal on D# terminal 104 is shown as a constant voltage 206 in reference to signal ground 208.

FIG. 2 shows the changes in outputs following a clock transition on CLK terminal 106 from a reset state 200 though a transition period 202 to a final evaluation state 204. In the FIG. 2 example, and subsequent to the change to an evaluation state 204, the data signal on D terminal 102 makes a transition 212 from a logic high state 210 to a logic low state 214. The difference of the signals (voltage on D# terminal 104)−(voltage on D terminal 102)=δV is shown here to be a significant positive quantity.

Recall that the output signals on O terminal 110 and O# 108 were tied together and to Vcc by PMOS transistors 154, 148, respectively. After being released by the clock transition period 202, both outputs on the O terminal 110 and O# terminal 108 begin at logic high states 226, 216. Once the data signal on D terminal 102 makes its transition 212 to a logic low state 214, the output signals are free to respond. In this exemplary case, the outputs on O# terminal 108 and on O terminal 110 begin to slowly move away from logic high 218, 228. Positive feedback on feedback connections 144, 146 then force the output on O# terminal 108 back 220 to logic high 222 and force the output on O terminal 110 more rapidly 230 to reach logic low 234. A "time to sense" 236 is defined as the period of time required by the differential sense amplifier 100 after an input transition 212 to first reach a final output logic state, in this example, a first time to reach logic low 232.

Figure 3:
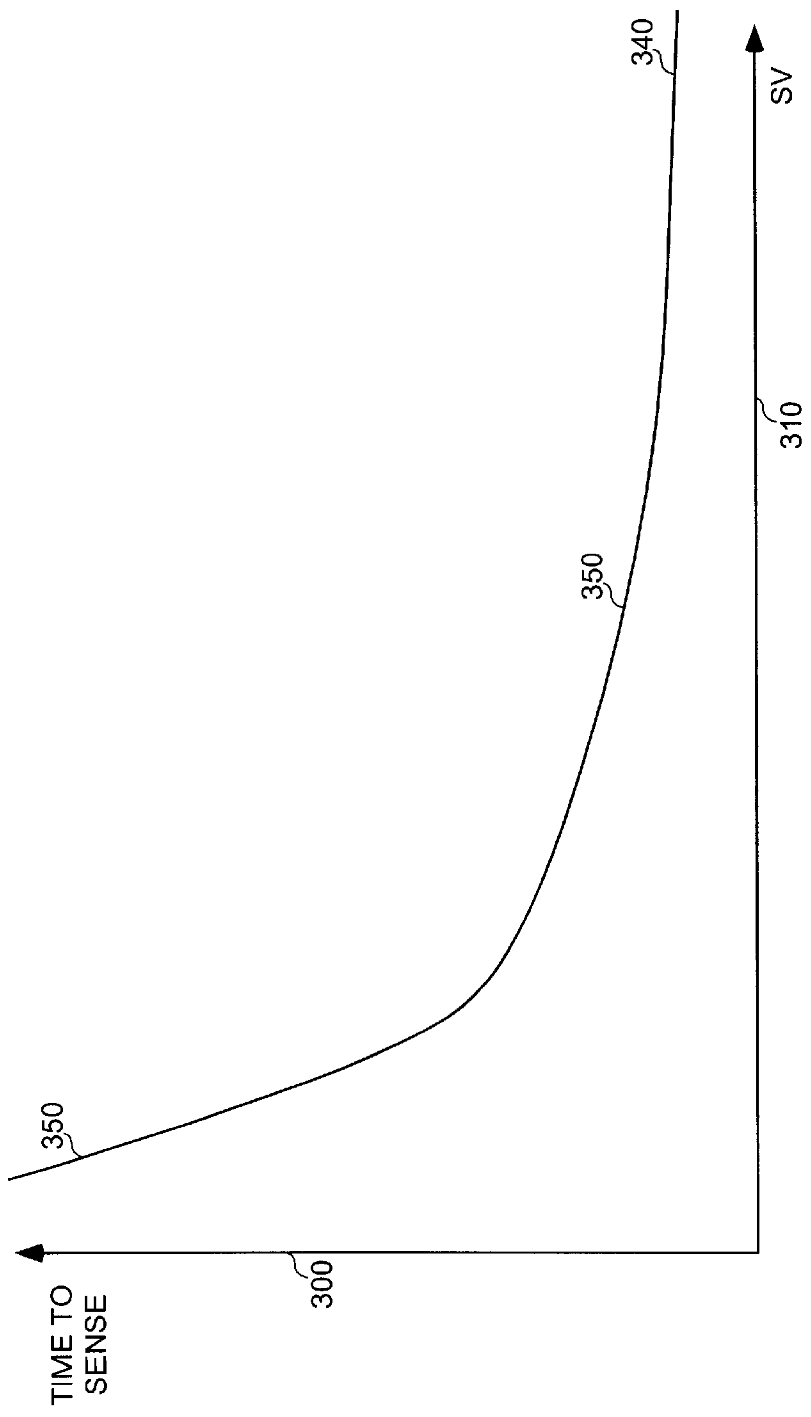
FIG. 3 is a chart showing the time to sense as a function of $\delta V$.

Referring now to FIG. 3, a chart showing the time to sense as a function of δV is shown. One axis 310 of the chart is the independent variable δV. The other axis 300 of the chart is the dependent variable time to sense, which is a function 320 of δV. When the input signals on D# terminal 104 and D terminal 102 have a relatively large difference δV, the differential sense amplifier 100 may quickly respond with an appropriate pair of signals on outputs O terminal 110 and O# terminal 108. However, when the value of δV is very small, the positive feedback connections 144, 146 cause the differential sense amplifier 110 to enter a meta-stable state. In this situation, at point 350 on function 320, the time to sense may become an arbitrarily long length of time.

Figure 4:
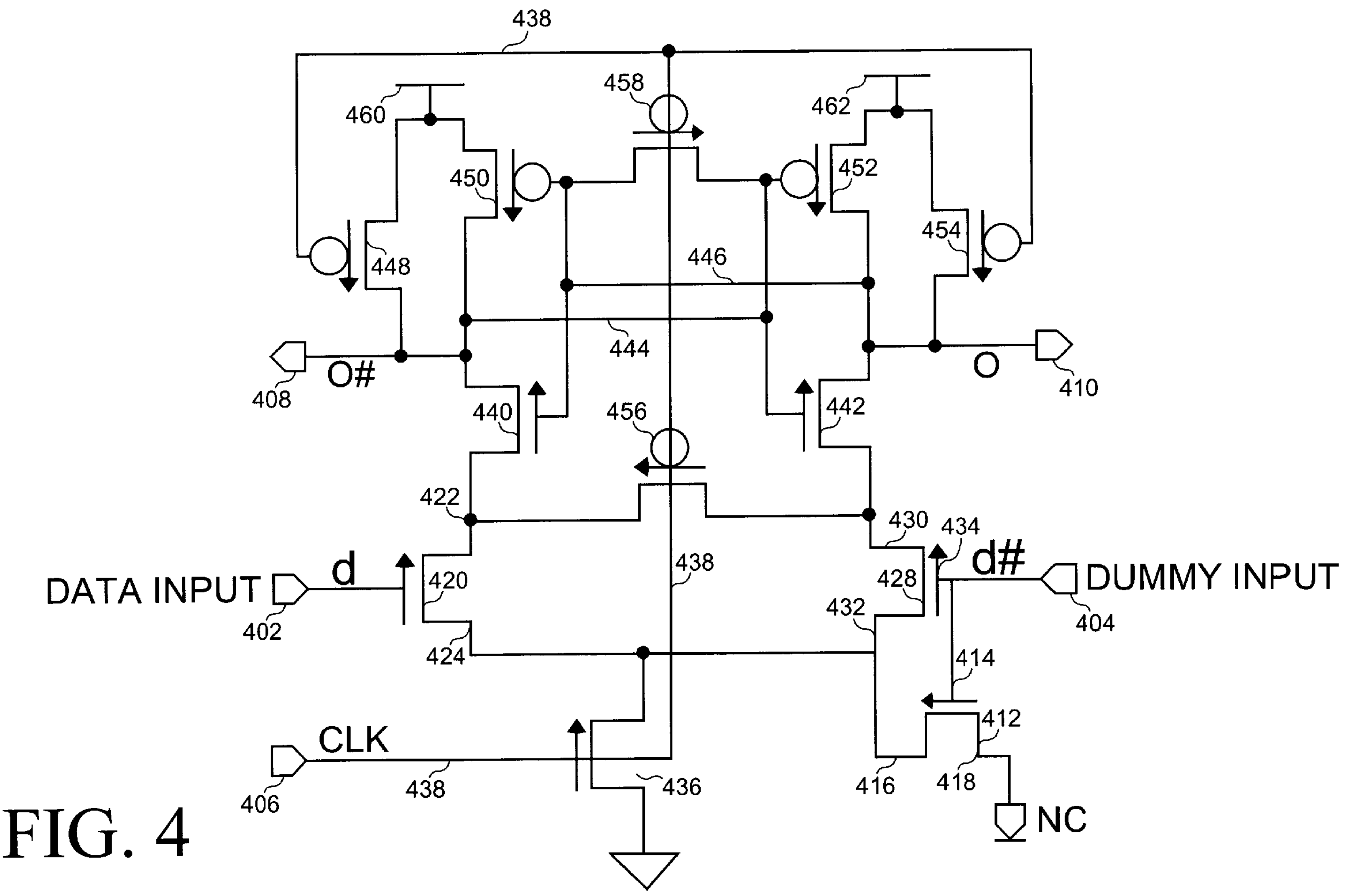
FIG. 4 is a schematic diagram of a single-ended sense amplifier, according to one embodiment.

Referring now to FIG. 4, a schematic diagram of a single-ended sense amplifier is shown, according to one embodiment. Single-ended sense amplifier 400 includes a non-inverting data input D terminal 402, an dummy data input D# terminal 404, a clock input CLK terminal 406, a non-inverted data output O terminal 410, and an inverted data output O# terminal 408.

Single-ended sense amplifier 400 uses a clock signal on CLK terminal 406 to keep the circuits in a reset state when not actively sensing. When the clock signal is at a logic low state (reset state), all P-channel metal-oxide-semiconductor (PMOS) transistors whose gates are tied to common gate connection 438 turn on. PMOS transistor 456 equalizes the drains 422, 430 of N-channel metal-oxide-semiconductor (NMOS) transistors 420, 428, respectively. PMOS transistor 458 equalizes the gates of PMOS transistors 450, 452. PMOS transistors 448, 454 connect O# terminal 408 to Vcc connection 460 and O terminal 410 to Vcc connection 462, respectively, equalizing the output signals. Also, when the clock signal is at a logic low state, NMOS transistor 436 turns off and removes a ground connection from sources 424, 432 of NMOS transistors 420, 428, respectively.

As was true with the differential sense amplifier 100 of FIG. 1, single-ended sense amplifier 400 utilizes positive feedback. Feedback path 444 gives positive feedback from the output totem-pole path of PMOS transistor 450 and NMOS transistor 440 to the inputs (gates) of PMOS transistor 452 and NMOS transistor 442. Similarly, feedback path 446 gives positive feedback from the output totem-pole path of PMOS transistor 452 and NMOS transistor 442 to the inputs (gates) of PMOS transistor 450 and NMOS transistor 440. It is noteworthy that feedback paths 444, 446 are connected via PMOS transistor 458 when the clock signal is in the reset state.

Single-ended sense amplifier 400 may then use the clock signal on CLK terminal 406 to enable the circuits for actively sensing. When the clock signal is at a logic high state (evaluation state), all P-channel metal-oxide-semiconductor (PMOS) transistors whose gates are tied to common gate connection 438 turn off. When turned off, PMOS transistor 458 disconnects the feedback paths 444, 446 and thereby disconnects the O# terminal 408 from the O terminal 410. When turned off, PMOS transistor 456 permits the voltages at drain 422 and drain 430 to vary. Finally, when turned off, PMOS transistors 448, 454 disconnect O# terminal 408 from Vcc connection 460 and O terminal 410 from Vcc connection 462, respectively, allowing the output signals to vary from Vcc. When the clock signal is at a logic high state, NMOS transistor 436 turns on and supplies a ground connection to sources 424, 432 of NMOS transistors 420, 428, respectively, allowing drain to source current to flow in NMOS transistors 420, 428.

One difference between the differential sense amplifier 100 of FIG. 1 and the single-ended sense amplifier 400 of FIG. 4 is the relative sizes of NMOS transistors 420, 428. In the FIG. 1 example, NMOS transistors 120, 128 were matched as best as possibly within overall design trade-offs. However, in the FIG. 4 embodiment, NMOS transistors 420, 428 are deliberately designed to have different sizes. In one embodiment, the size of an NMOS transistor is proportionate to the geometric area of the transistor's gate. A controlled offset in the response to voltages applied to D terminal 402 and D# terminal 434 is introduced by designing NMOS transistor 420 to have a size much greater than the size of NMOS transistor 428. A controlled offset may be functionally related to the skew ratio=(size of NMOS transistor 420/size of NMOS transistor 428). In one embodiment, the skew ratio is between 2 and 6.

In order for the smaller NMOS transistor 428 to match the response of NMOS transistor 420, a second NMOS transistor 412 is connected within single-ended sense amplifier 400. The gates 434, 414 of NMOS transistors 428, 412, respectively, are connected together and to the D# terminal 404. The source 416 of NMOS transistor 412 is connected to the drain 432 of NMOS transistor 428. However, the drain 418 of NMOS transistor 412 remains not connected to other circuit elements. In one embodiment, the sizes of the three NMOS transistors 420, 428, 412 is given by the equation (size of NMOS transistor 420)=(size of NMOS transistor 428)+(size of NMOS transistor 412).

Figure 5:
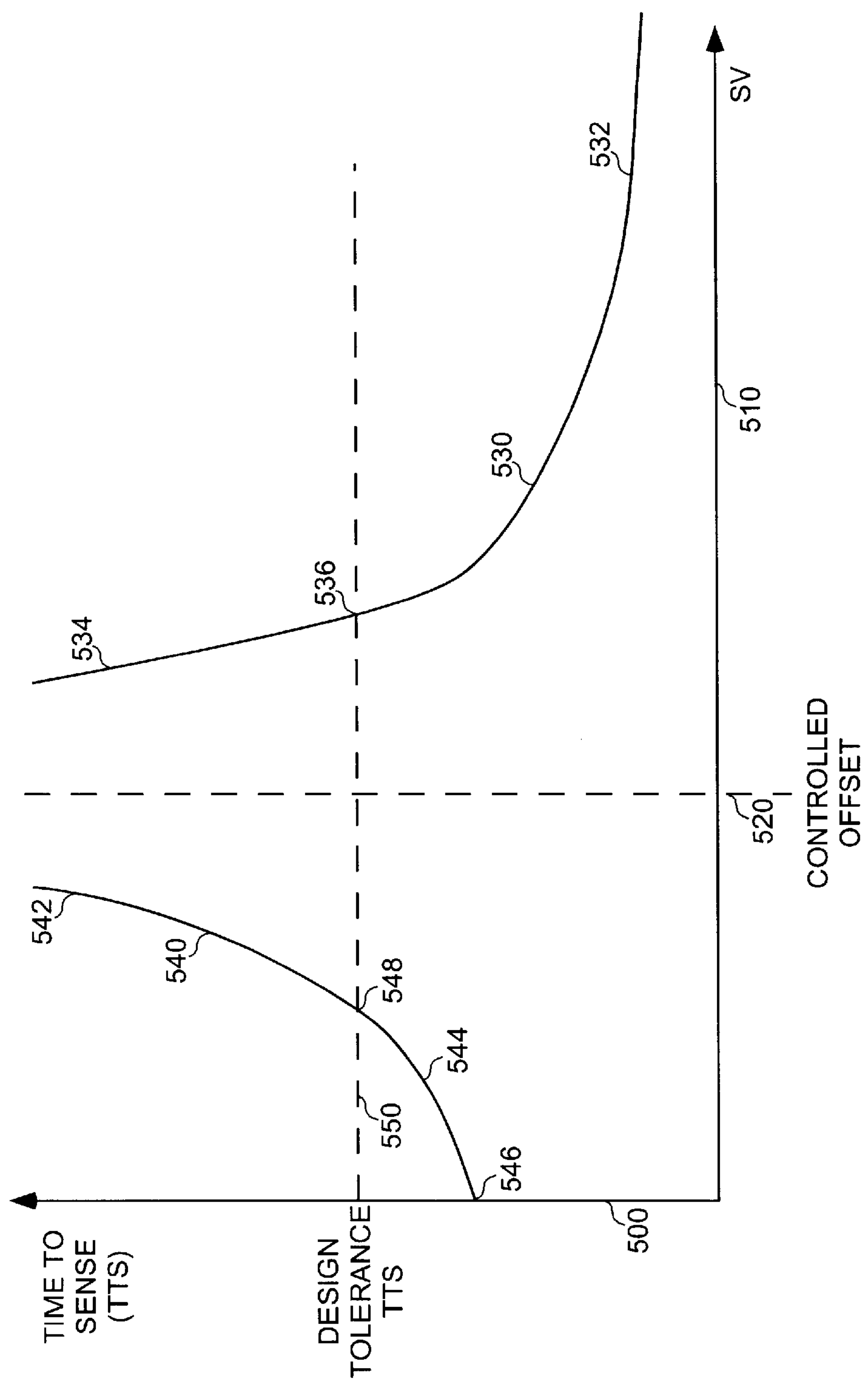
FIG. 5 is a chart showing the time to sense as a function of $\delta V$, according to one embodiment of the present invention.

Referring now to FIG. 5, a chart showing the time to sense as a function of δV is shown, according to one embodiment of the present invention. When the single-ended sense amplifier 400 has the D# terminal 404 connected to a dummy input signal close in value to Vcc, the relationship of time to sense as a function δV is given by the pair of curves 530, 540. The regions of meta-stability 534, 542 no longer surround δV=0, but now surround a non-zero value of δV called a controlled offset 520. It is noteworthy that, at δV=0, the time to sense is a specific finite number 546.

In one embodiment, the desired maximum time that may be consumed by the sense amplifier, called a design tolerable time to sense 550, may lie above the functional curves 540, 530. In this case, the value of the controlled offset 520 may be shifted for optimal benefit by changing the skew ratio of NMOS transistors 420, 428 of single-ended sense amplifier 400. In this manner the two designed values of δV may become centered in the portions of the functional curve 544, 532 lying below the design tolerable time to sense 550.

Figure 6:
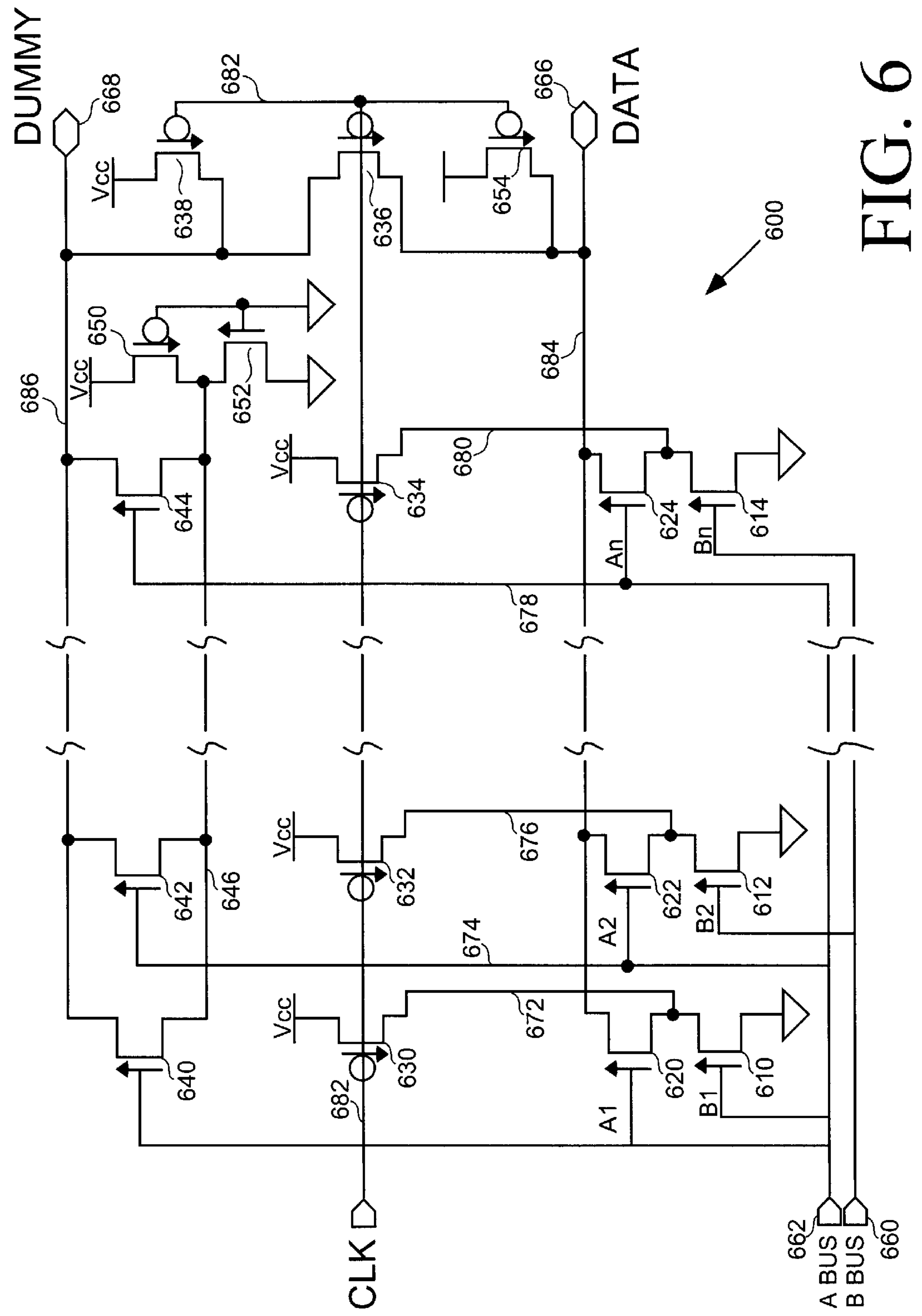
FIG. 6 is a schematic diagram of a dummy complimentary data path, according to another embodiment of the present invention

Referring now to FIG. 6, a schematic diagram of a dummy complimentary data path is shown, according to another embodiment of the present invention. When utilizing the single-ended sense amplifier 400 of FIG. 4, a dummy input may be connected to D# terminal 404. In one embodiment, the dummy input may be Vcc. However, this choice is not optimal, in that the low source impedance noise on Vcc would couple strongly into single-ended sense amplifier 400 via the D# terminal 404. Therefore, in an alternate embodiment, PLA circuit with dummy complimentary data path 600 may be utilized.

In the FIG. 4 embodiment, an exemplary PLA implementation of the overall logical "or" of the logical "and" of signals Ai and Bi is shown. In alternate embodiments, other kinds of arithmetic or logical expressions could be expressed in a PLA circuit. The PLA circuit with dummy complimentary data path 600 evaluates the expression [(A1 and B1)# or (A2 and B2)# or . . . or (An and Bn)#]. The quantity n signals Ai enter on A bus terminal 662 and the quantity n signals Bi enter on B bus terminal 660. A1 signal path 670 connects signal A1 to the gates of NMOS 620 and NMOS 640; A2 signal path 674 connects signal A2 to the gates of NMOS 622 and NMOS 642; and similarly with the other Ai until An signal path 678 connects signal An to the gates of NMOS 624 and NMOS 644. Similarly, the B1 signal is connected to the gate of NMOS 610; the B2 signal is connected to the gate of NMOS 612; and similarly with the other Bi until the Bn signal is connected to the gate of NMOS 614. In a steady-state condition, if any two signals Ai and Bi are both true (logic high), then the pair of NMOS transistors whose gates are connected to Ai and Bi will both turn on, and connect summation signal path 684 to ground (logic low).

Each NMOS pair, for example NMOS 610 and NMOS 620, have their common node equalized by a corresponding PMOS transistor configured as a charge sharing device, for example PMOS 630. When the clock on CLK distribution signal path 682 is in the reset state (logic low), PMOS 630 sends charge to the common node via A1 reset signal path 672. A1 reset signal path 672 is disconnected from the source of Vcc when the clock on CLK distribution signal path 682 is in the evaluation state (logic high).

In the FIG. 6 embodiment, a complimentary data path to that of Data Output signal path 684 is not implemented. Instead, a Dummy Output signal path 686 is created. Both Data Output signal path 684 and Dummy Output signal path 686 are precharged to Vcc by charge sharing devices PMOS 654 and PMOS 638, respectively, when the clock on CLK distribution signal path 682 is in the reset state. At this time the Data Output signal path 684 and Dummy Output signal path 686 are equalized by the action of PMOS 636. When the clock on CLK distribution signal path 682 is in the evaluation state, PMOS 636, PMOS 638, and PMOS 654 all turn off, thereby allowing the evaluation of the Data Output and Dummy Output signals.

The Dummy Output is formed by a single series of NMOS transistors, NMOS 640, NMOS 642, on up to NMOS 644. The sources of these NMOS transistors are connected to pseudo-Vcc signal path 646. The signal on pseudo-Vcc signal path 646 is generated by large NMOS 652 and large PMOS 650. In one embodiment, large NMOS 652 and large PMOS 650 are selected to have gate-to-drain capacitances equal to the sum of the gate-to-drain capacitiances of the B bus transistors NMOS 610, NMOS 612, up through NMOS 614. By reproducing only a portion of the circuitry required to form a complimentary data path to that of Data Output signal path 684, far fewer devices need be fabricated and the size of the charge sharing device transistors PMOS 630, PMOS 632, up through PMOS 634 may be reduced. Additionally, the speed of Dummy Output signal path 686 may be faster than a corresponding complimentary data path to that of Data Output signal path 684.

Figure 7:
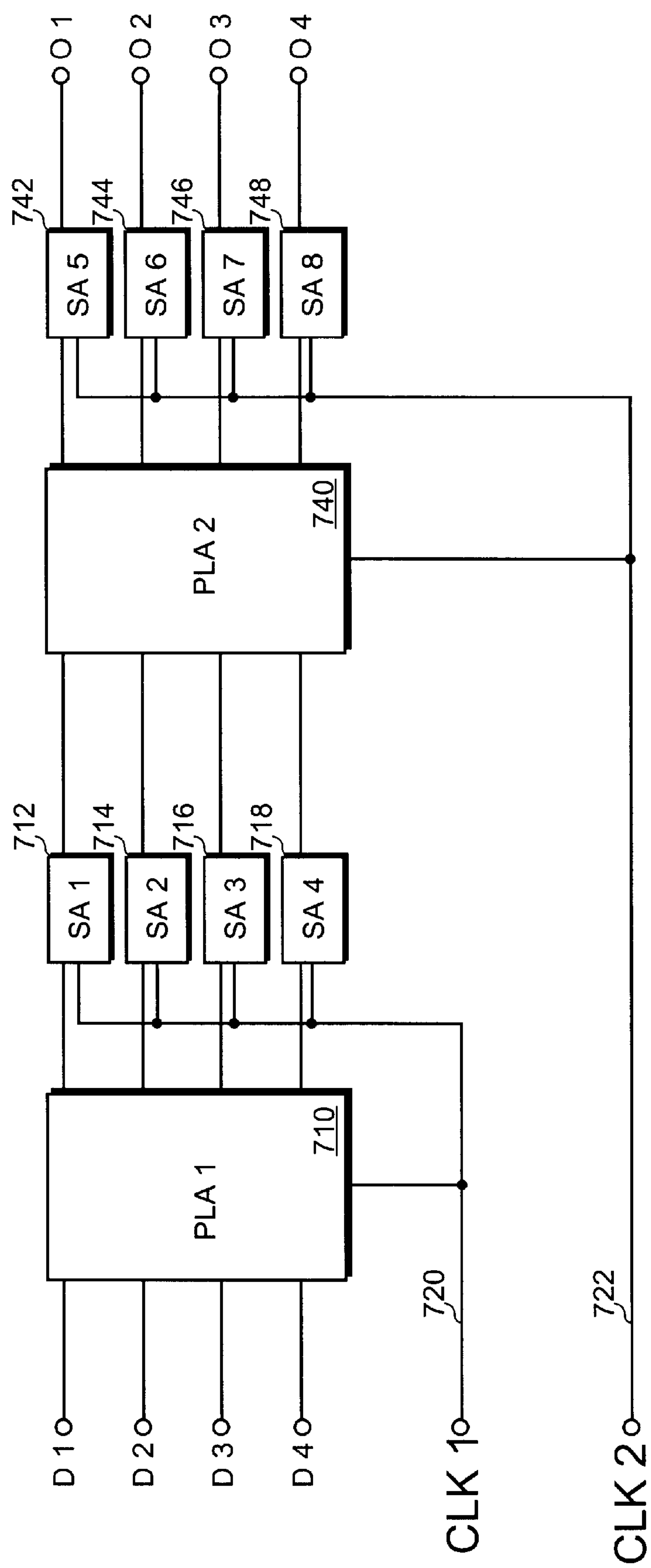
FIG. 7 is a system block diagram of a chained PLA system, according to one embodiment.

Referring now to FIG. 7, a system block diagram of a chained PLA system is shown, according to one embodiment. A series of data inputs D1, D2, D3, and D4 feed a first PLA1 710. This first PLA1 710 has a series of data outputs feeding a series of four sense amplifiers SA1 712, SA2 714, SA3 716, and SA4 718. The data outputs of the four sense amplifiers SA1 712, SA2 714, SA3 716, and SA4 718 are used as data inputs for a second PLA2 740. This second PLA2 740 has a series of data outputs feeding a series of four sense amplifiers SA5 742, SA6 744, SA7 746, and SA8 748. The data outputs of the four sense amplifiers SA5 742, SA6 744, SA7 746, and SA8 748 form the final outputs of the sequenced pair of PLAs.

In order to obtain maximum performance from a sequenced pair of PLAs, a pair of clocks CLK1 720 and CLK2 722 are used. These clocks should minimize potential race conditions in the sequenced pair of PLAs. This may be difficult to achieve because approximately 8 to 10 stages of gate delay may be necessary to obtain a wide enough clock pulse.

Figure 8:
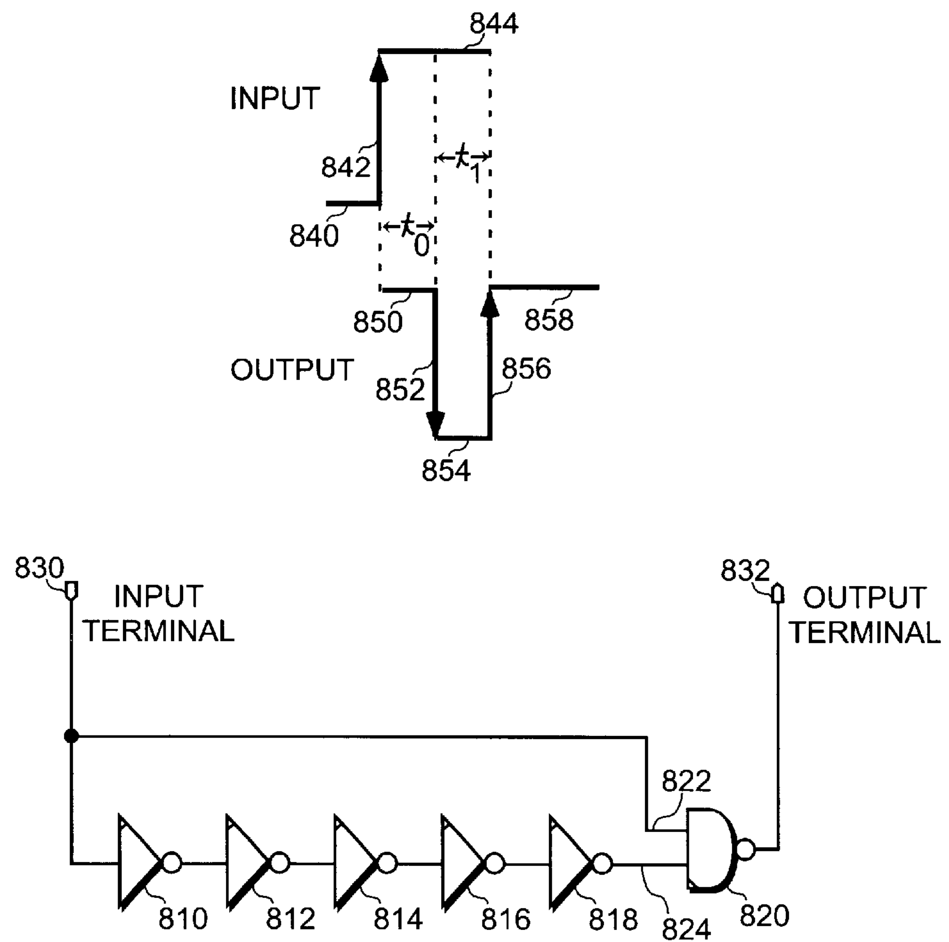
FIG. 8 is a schematic diagram of a clock pulse generator.

Referring now to FIG. 8, a schematic diagram of a clock pulse generator is shown. In the FIG. 8 embodiment, a series of logical inverters 810, 812, 814, 816, and 818 are used. In other embodiments, any odd number of inverters may be used, or an odd or even number of non-inverting buffers may be used.

When an input signal clock at initial low level 840 is applied to input terminal 830, input 822 of negative and (NAND) gate 820 is low and input 824 is high. Thus the signal on output terminal 832 is initially high 850. The input clock signal makes a transition 842 to a high state 844. Then, after a delay period t0, at input 822 there is a logic high, and at input 824 (due to the delay in inverters 810, 812, 814, 816, and 818) the signal remains high. Since the inputs of NAND gate 820 are both high, the signal on the output terminal 832 makes a transition 852 to a low state 854.

After a subsequent time period t1, corresponding to the delay period in inverters 810, 812, 814, 816, and 818, input 822 of NAND gate 820 remains high but input 824 makes a transition to low. Therefore the signal on the output terminal 832 makes a transition 856 to a high state 858. In this manner, a pulse whose width is dependent upon the delay time of a series of buffers is generated from a single logical transition.

Figure 9A:
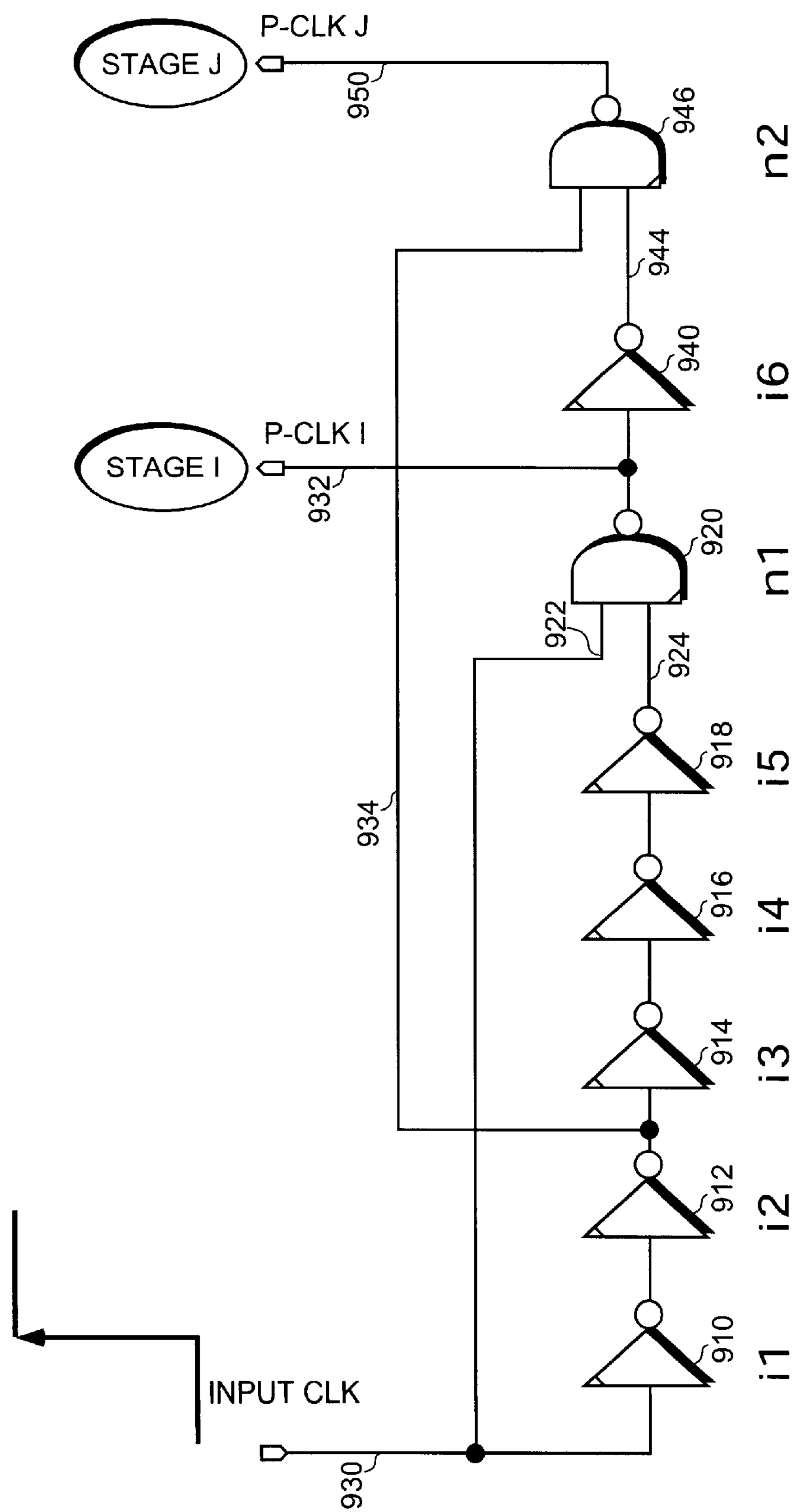
FIG. 9A is a schematic diagram of a locking self-timed pulsed clock, according to one embodiment of the present invention.
Figure 9B:
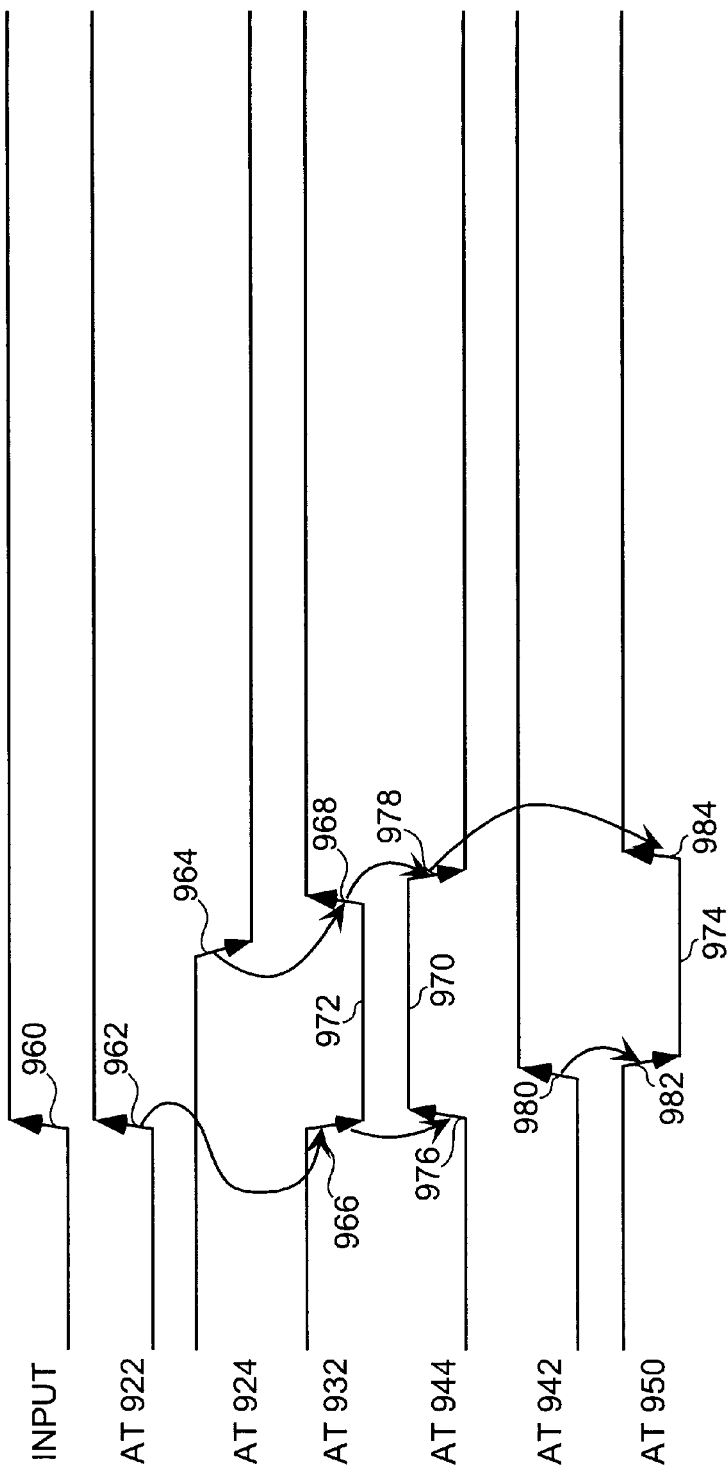
FIG. 9B is an associated timing diagram for the circuit of FIG. 9A, according to one embodiment of the present invention.

Referring now to FIGS. 9A and 9B, a schematic diagram of a locking self-timed pulsed clock and associated timing diagram is shown, according to one embodiment of the present invention. In the FIG. 9 embodiment, the five inverters 910, 912, 914, 916, and 918 and NAND gate 920 are configured as their counterparts shown in FIG. 8. Hence the P-CLK I signal on signal line 932 is comparable to the clock on output terminal 832 of FIG. 8. In FIG. 9B, when input signal has a positive transition 960, a short while later the signal at input 922 of NAND gate 920 has a positive transition 962. The equivalent negative transition 964 at the input 924 of NAND gate 920 occurs after a delay induced by the five inverters 910, 912, 914, 916, and 918. During the period when the signal at input 922 is logic high and the signal at input 924 remains at logic high, a negative-going pulse 972 is generated on the P-CLK I signal line 932. The falling edge 966 of pulse 972 follows the rising edge 962, and the rising edge 968 of pulse 972 follows the falling edge 964.

An inverted and delayed version of this pulse 970 is presented to input 944 of NAND gate 946. A delayed positive transition 980 on signal line 934 is presented to input 942 of NAND gate 946. Note that the positive transition 980 is the input delayed by inverters 910, 912, and that the positive transition 976 tracks the input but is delayed by NAND gate 920 and inverter 940. The propagation delays in inverters 910, 912 are designed to be longer than the propagation delays in NAND gate 920 and inverter 940 by a positive margin. This insures that positive transition 980 occurs subsequent to positive transition 976. During the period when both inputs of NAND gate 946 are held at logic high, a negative-going pulse 974 is generated on the P-CLK J signal line 950. The falling edge 982 of pulse 974 follows the rising edge 980, and the rising edge 984 of pulse 974 follows the falling edge 978.

Note that the negative-going pulse 974 on the P-CLK J signal line 950 follows in time the negative-going pulse 972 on the P-CLK I signal line 932 by a carefully controlled amount of time. This amount of time is controlled because the circuits generating P-CLK I and P-CLK J share certain delaying elements, such as the five inverters 910, 912, 914, 916, and 918, and the NAND gate 920. Any variations in timing due to device-to-device variations in these circuit elements is minimized because the devices, being common, contribute the same variation to both circuit paths.

Figure 10:
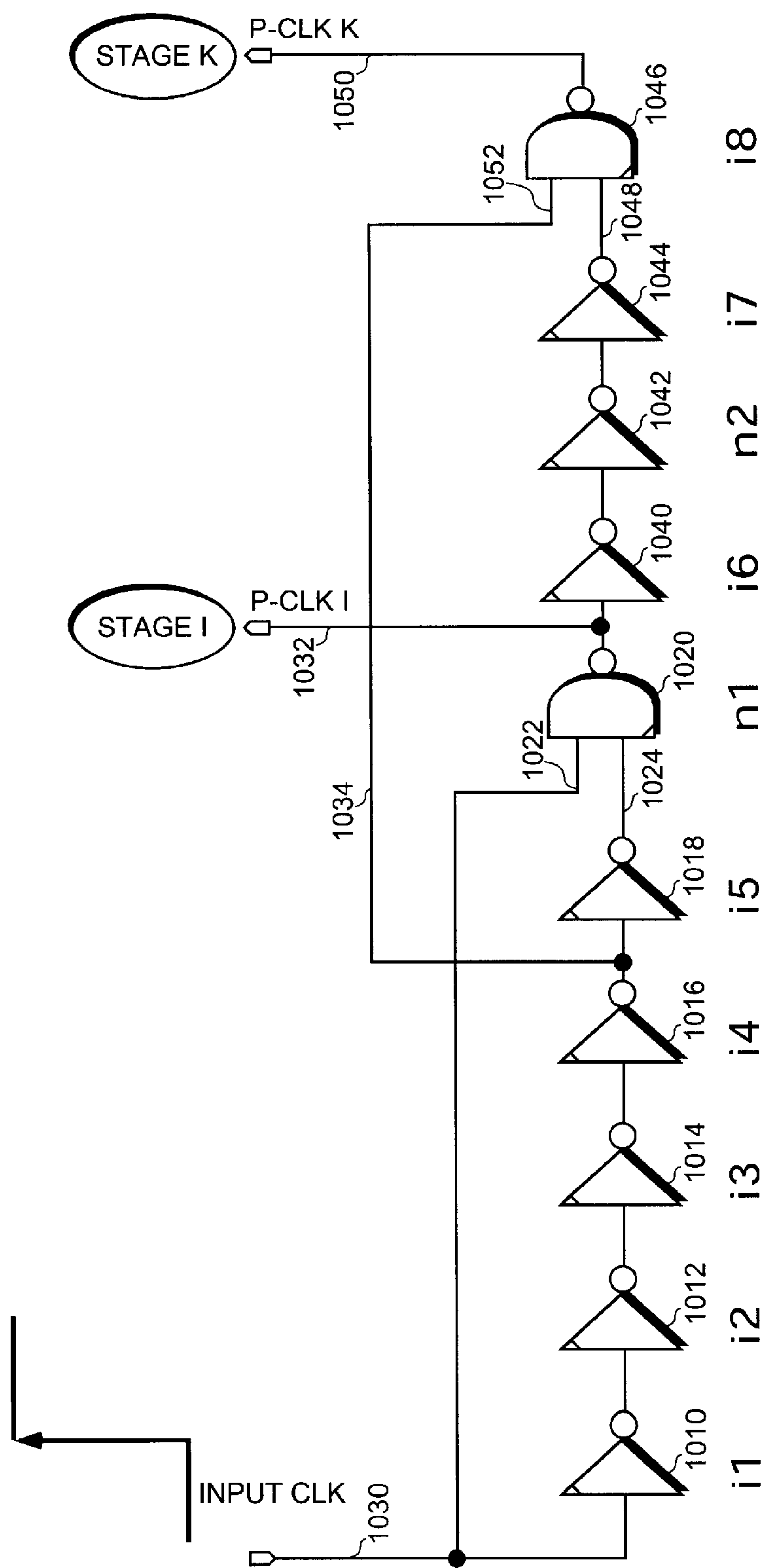
FIG. 10 is a schematic diagram of a locking self-timed pulsed clock, according to another embodiment of the present invention.

Referring now to FIG. 10, a schematic diagram of a locking self-timed pulsed clock is shown, according to another embodiment of the present invention. The timing of the two FIG. 10 clocks, P-CLK I and P-CLK K, is similar to the two clocks in the FIGS. 9A and 9B embodiment. The FIG. 10 circuit generating P-CLK I is comparable to that which generates P-CLK I in FIG. 9A.

The FIG. 10 circuit generating P-CLK K contains additional delay when compared with the circuit of FIG. 9A. Signal path 1034, which is connected to input 1052 of NAND gate 1046, is attached after inverter 1016, and therefore has two additional inverter delays when compared to signal path 934 of FIG. 9A. Similarly, the signal connected to input 1048 of NAND gate 1046 passes through three inverters 1040, 1042, and 1044 after leaving the source of P-CLK I, rather than the single inverter 940 of FIG. 9A. Thus both inputs 1052, 1048 of NAND gate 1046 receive signals delayed two inverter delays when compared to the circuit of FIG. 9A. Therefore, P-CLK K on signal path 1050 has similar timing with the addition of additional delay. The FIG. 10 embodiment, like the FIG. 9A embodiment, advantageously minimizes variations in timing between the two clocks P-CLK I and P-CLK K.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A system comprising:

a first programmable logic array (PLA);

a first set of sense amplifiers coupled to the output of the first PLA; and a clock pulse generator coupled to the first PLA and the first set of sense amplifiers, wherein the clock pulse generator comprises:

an input terminal to receive an edge signal;

a first clock pulse path coupled to the input terminal that includes a first set of delay elements that generates a first clock signal responsive to the edge signal; and a first output terminal coupled to the input terminal that transmits the first clock signal.

2. The system of claim 1 further comprising:

a second PLA coupled to the output of the first set of sense amplifiers and the clock pulse generator; and second set of sense amplifiers coupled to the output of the second PLA.

3. The system of claim 2 wherein the clock pulse generator further comprises:

a second clock pulse path coupled to the first clock pulse path that includes a second set of delay elements that generates a second clock signal responsive to the edge signal and the first clock signal; and a second output terminal coupled to the second clock pulse path, the second PLA and the second set of sense amplifiers, that transmits the second clock signal.

4. The system of claim 1, wherein the first set of delay elements includes:

a first set of inverters; and a first NAND gate.

5. The system of claim 3, wherein the second set of delay elements includes:

a second set of inverters; and a second NAND gate.

6. The system of claim 4, wherein the first set of inverters comprises an odd number of inverters.

7. The system of claim 5, wherein the second set of inverters comprises an even number of inverters.

8. The system of claim 3, wherein the first set of delay elements and the second set of delay elements include a plurality of logic circuit elements.

9. The system of claim 8, wherein an input of the second set of delay elements is coupled to an intermediate point within the first set of delay elements.

* * * * *